US012627147B2

(12) United States Patent
Santhanam et al.

(10) Patent No.: US 12,627,147 B2
(45) Date of Patent: May 12, 2026

(54) INTEGRATED SWITCHED CAPACITOR BANK WITH ZERO CLOSE CONTROL

(71) Applicant: Aclara Technologies LLC, St. Louis, MO (US)

(72) Inventors: Balaji Santhanam, Boonton, NJ (US); Juliene Britt, Birmingham, AL (US); David S. Yaney, Poolesville, MD (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

(21) Appl. No.: 18/910,613

(22) Filed: Oct. 9, 2024

(65) Prior Publication Data

US 2025/0125621 A1     Apr. 17, 2025

Related U.S. Application Data

(60) Provisional application No. 63/589,548, filed on Oct. 11, 2023.

(51) Int. Cl.
*H02J 3/20*          (2006.01)
*H02J 13/00*         (2006.01)
*H05K 7/14*          (2006.01)

(52) U.S. Cl.
CPC .......... *H02J 3/20* (2013.01); *H02J 13/00002* (2020.01); *H05K 7/14* (2013.01)

(58) Field of Classification Search
CPC ......... H02J 3/20; H02J 13/00002; H05K 7/14
See application file for complete search history.

(56) References Cited

U.S. PATENT DOCUMENTS

| | | | |
|---|---|---|---|
| 2015/0177306 A1* | 6/2015 | Hedlund | G01R 31/64 |
| | | | 324/548 |
| 2016/0006186 A1 | 1/2016 | Aizawa | |
| 2017/0294786 A1* | 10/2017 | Gerovac | H02J 7/0068 |
| 2021/0083478 A1* | 3/2021 | Hao | H02J 13/00022 |
| 2023/0006798 A1 | 1/2023 | Lee et al. | |

OTHER PUBLICATIONS

International Search Report and Written Opinion for Application No. PCT/US2024/050557 dated Dec. 18, 2024 (9 pages).

* cited by examiner

*Primary Examiner* — Daniel Cavallari
*Assistant Examiner* — Thai H Tran
(74) *Attorney, Agent, or Firm* — Michael Best & Friedrich LLP

(57)          ABSTRACT

A switched capacitor bank system including a switched capacitor bank assembly having a switch between a capacitor and a phase line, a first voltage sensor to sense a phase line voltage, and a second voltage sensor to sense a capacitor voltage. The switched capacitor bank system includes a wireless current sensor to sense a current of the phase line and an electronic controller configured to receive a first voltage signal from the first voltage sensor, a second voltage signal from the second voltage sensor, a current signal from the wireless current sensor, determine a phase shift calculation for the voltage of the phase line based on the current signal, determine when the voltage of the phase line is at zero by comparing the first voltage signal, the second voltage signal, and the phase shift calculation, and close the switch when the voltage of the phase line is at zero.

20 Claims, 10 Drawing Sheets

115A-115C 405A-405C 405D-405F 410A-410C 115A-115C 410A-410C 415A-415C 115A-115C 420A-420C

ICS = Integrated Cap Switch
ZCS = Zero Close Switch
ZCC = Zero Close Controller
WCS = Wireless Current Sensor (option)
HMI = Human Machine Interface (option)

INTEGRATED SWITCHED CAPACITOR BANK WITH ZERO CLOSE CONTROL

RELATED APPLICATIONS

This application claims the benefit of U.S. Provisional Patent Application No. 63/589,548, filed Oct. 11, 2023, the entire content of which is hereby incorporated by reference.

FIELD

Embodiments relate to capacitor bank switch assemblies.

SUMMARY

Switched capacitor banks may be installed on poles and/or at substations to apply power factor correction (e.g., by altering the load phasing) to the power grid in response to the application and removal of heavy industrial inductive loads. When loads are not in phase, additional reactive currents increase transmission losses, which may result in wasted energy and a need for additional generating capacity. Thus, capacitor banks are used to help improve the transfer efficiency of electrical energy being transmitted through the power grid. Charging and discharging of the capacitors is controlled with switches based on power factor correction needs of the grid. The charging and discharging of capacitors may be switched via the switches to optimize voltage and power flow to the power grid while reducing transmission losses.

Given the complexity and variety of existing switched capacitor bank assembly configurations, complicated sensor and controller combinations are often utilized in an attempt to improve assembly performance. As a result, these assemblies may require long install times, may be difficult to troubleshoot, and may be expensive to maintain over the course of an assembly's lifespan. In addition, the sensing accuracy in existing capacitor bank assemblies may suffer due to magnitude and phase errors and signal interference caused by lengthy sensor and control cables included in the assembly. Thus, a solution that simplifies the complexity of the capacitor bank assembly, reduces installation time, and significantly reduces the troubleshooting and maintenance costs associated to capacitor banks over the life of the capacitor bank is desired.

One aspect of the present disclosure provides a switched capacitor bank system including a switched capacitor bank assembly. The switched capacitor bank assembly further includes a first capacitor, a first switch selectively connected between the first capacitor and a first phase line, a first voltage sensor integrated within a housing of the first switch and configured to sense a voltage of the first phase line, a second voltage sensor integrated within the housing of the first switch and configured to sense a voltage of the first capacitor; a frame arranged to physically support the first capacitor, the first switch, the first voltage sensor, and the second voltage sensor, and a first wireless current sensor attached to the first phase line and configured to sense a current of the first phase line. The switched capacitor bank assembly further includes an electronic controller including an electronic processor, the electronic controller operably coupled to the first switch, the first voltage sensor, the second voltage sensor, the first wireless current sensor. The electronic controller is configured to receive a first voltage signal indicative of the voltage of the first phase line from the first voltage sensor, receive a second voltage signal indicative of the voltage of the first capacitor from the second voltage sensor, receive a first current signal indicative of the current of the first phase line from the first wireless current sensor and determine a first phase shift calculation for the voltage of the first phase line based on the first current signal. The electronic controller is further configured to determine when the voltage of the first phase line is at zero by comparing the first voltage signal, the second voltage signal, and the first phase shift calculation and close the first switch when the voltage of the first phase line is at zero.

Another aspect of the present disclosure provides a method for controlling a switched capacitor bank system. The switched capacitor bank system includes a switched capacitor bank assembly having a first capacitor, a first switch selectively connected between the first capacitor and a first phase line, a first voltage sensor integrated within a housing of the first switch and configured to sense a voltage of the first phase line, a second voltage sensor integrated within the housing of the first switch and configured to sense a voltage of the first capacitor, and a frame arranged to physically support the first capacitor, the first switch, the first voltage sensor, and the second voltage sensor. The switched capacitor bank system also includes a first wireless current sensor attached to the first phase line and configured to sense a current of the first phase line and an electronic controller including an electronic processor, the electronic controller operably coupled to the first switch, the first voltage sensor, the second voltage sensor, the first wireless current sensor. The method includes receiving, via the electronic controller, a first voltage signal indicative of the voltage of the first phase line from the first voltage sensor, receiving, via the electronic controller, a second voltage signal indicative of the voltage of the first capacitor from the second voltage sensor, receiving, via the electronic controller, a first current signal indicative of the current of the first phase line from the first wireless current sensor, and determining, via the electronic controller, a first phase shift calculation for the voltage of the first phase line based on the first current signal. The method also includes determining, via the electronic controller, when the voltage of the first phase line is at zero by comparing the first voltage signal, the second voltage signal, and the first phase shift calculation and transmitting, via the electronic controller, a command to close the first switch when the voltage of the first phase line is at zero.

Another aspect of the present disclosure provides a switched capacitor bank system including a plurality of phase lines and a switched capacitor bank assembly. The plurality of phase lines further including a first phase line, a second phase line, and a third phase line. The switched capacitor bank assembly includes a plurality of capacitors including a first capacitor, a second capacitor, and a third capacitor. The switched capacitor bank assembly further includes a plurality of voltage sensors having a first voltage sensor configured to sense a voltage of the first phase line, a second voltage sensor configured to sense a voltage of the first capacitor, a third voltage sensor configured to sense a voltage of the second phase line, a fourth voltage sensor configured to sense a voltage of the second capacitor, a fifth voltage sensor configured to sense a voltage of the third phase line, and a sixth voltage sensor configured to sense a voltage of the third capacitor. The switched capacitor bank assembly further includes a plurality of switches having a first switch connected between the first phase line and the first capacitor, a second switch connected between the second phase line and the second capacitor, and a third switch connected between the third phase line and the third capacitor. The switched capacitor bank assembly further includes a frame arranged to physically support the plurality of capacitors, the plurality of voltage sensors, and the plurality of switches. The switched capacitor bank system also includes a plurality of wireless current sensors having a first wireless current sensor attached to the first phase line and configured to sense a current of the first phase line, a second wireless current sensor attached to the second phase line and configured to sense a current of the second phase line, and a third wireless current sensor attached to the third phase line and configured to sense a current of the third phase line. The switched capacitor bank system also includes an electronic controller including an electronic processor, the electronic controller operably coupled to the switched capacitor bank assembly and the plurality of wireless current sensors, the controller configured to selectively close the plurality of switches to connect the plurality of capacitors to the respective ones of the plurality of phase lines based on signals received from the plurality of voltage sensors and the plurality of wireless current sensors.

Other aspects of the disclosure will become apparent by consideration of the detailed description and accompanying drawings.

DETAILED DESCRIPTION

Figure 1:
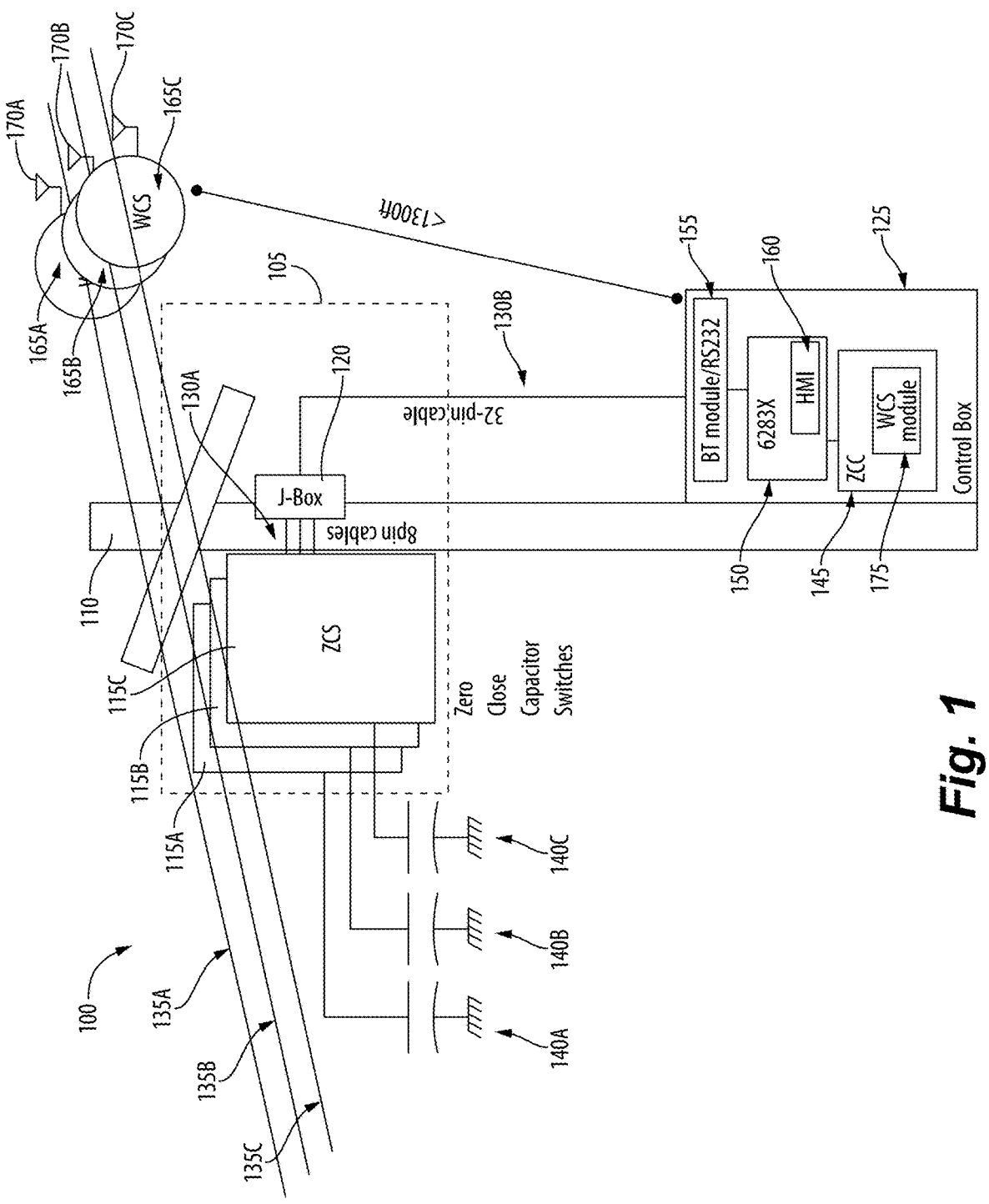
FIG. 1 illustrates a switched capacitor bank system according to some embodiments.

FIG. 1 illustrates a switched capacitor bank system 100 according to some embodiments of the present disclosure. Switched capacitor bank systems, such as the switched capacitor bank system 100, are highly complex, engineered-to-order solutions that require a combination of several components provided by various manufacturers. Key components of a typical switched capacitor bank include capacitors, capacitor switches, a controller, current and/or voltage sensors, junction boxes, cable assemblies, arresters, wildlife protectors, power transformers, and/or other devices.

For example, the illustrated switched capacitor system 100, which is a pole-mounted assembly used in medium voltage applications (e.g., approximately 5 kV-38 kV), includes numerous third-party components that are separately installed and interconnected by an assembly of cables (or other connections). As shown, the switched capacitor bank system 100 includes a switched capacitor bank assembly (e.g., a capacitor bank) 105 that is installed on distribution pole 110 at an elevation above ground (e.g., the elevation may be between approximately 30 and 50 feet above ground). The capacitor bank 105 includes capacitors, capacitor switches 115A-115C, a junction box 120, power transformer, and voltage sensors. The capacitors, power transformer, and voltage sensors are further described below with reference to FIGS. 3 and 4. The switched capacitor bank system 100 further includes a control cabinet 125 (e.g., a control box), which is installed at the bottom of distribution pole 110 (e.g., approximately 5 feet above ground). The switched capacitor bank system 100 further includes numerous cables 130 that may be used to interconnect the components of the switched capacitor bank system 100. For example, one or more switch cables 130A, which may be 8-pin cables, connect the capacitor switches 115A-115C to the junction box 120. In addition, one or more control cables 130B, which may be 32-pin cables, connect the control cabinet 125 to the capacitor switches 115A-115C, the junction box 120, and/or other working components of the switched capacitor bank system 100.

In some embodiments, the switched capacitor bank system 100 is a multi-phase power system, such as a distribution network, in which the switched capacitor bank assembly 105 is installed. As such, the switched capacitor bank system 100 includes three-phase distribution, or phase, lines 135A-135C. For example, the phase lines 135A-135C include a first phase line 135A, a second phase line 135B, and a third phase line 135C. Each of the phase lines 135A-135C is configured to distribute voltage provided by a power source. As described in further detail below with reference to FIGS. 3 and 4, each of the capacitor switches 115A-115C is configured to selectively connect each capacitor to the phase lines 135A-135C, respectively. In particular, each of the capacitor switches 115A-115C selectively connects each capacitor between the phase lines 135A-135C and ground 140A-140C, respectively. Although the ground 140A-140C is illustrated as being separate ground connections corresponding to each capacitor switch 115A-115C, it should be understood that the ground 140A-140C may be a common ground between the capacitor switches 115A-115C.

In some embodiments, the control cabinet 125 includes an electronic controller 145, a capacitor bank controller 150, and a communication module 155. Although illustrated separately in FIG. 1, it should be understood that the electronic controller 145, the capacitor bank controller 150, and the communication module 155 may be incorporated into single controller of the control cabinet 125. In some embodiments, the electronic controller 145 is configured to perform zero close control to monitor voltage and/or current of the switched capacitor bank system 100 based on inputs received from various components of the switched capacitor bank system 100. The electronic controller 145 is communicatively connected to the capacitor bank controller 150, in which the capacitor bank controller 150 further includes a human machine interface (HMI) 160. For example, the capacitor bank controller 150 may be the 6283X Three Phase Digital Capacitor Bank Control manufactured by Beckwith Electric of Largo, Florida. In some embodiments, the capacitor bank controller 150 is configured to transmit a command to open and/or close the capacitor switches 115A-115C. The HMI 160 is configured to receive input from a service technician and/or output information to a service technician concerning the switched capacitor bank assembly 105. In some embodiments, the HMI 160 includes a plurality of input mechanisms used by a service technician to manually operate the capacitor switches 115A-115C. In some embodiments, the HMI 160 includes a display (for example, a primary display, a secondary display, etc.) and/or other output devices (light-emitting diodes ("LEDs"), speakers, etc.) for outputting a status of the switched capacitor bank assembly 105 to a technician.

In some embodiments, one or more of the components of the HMI 160 are located in the control cabinet 125 such that the one or more components can be easily accessed by a service technician (e.g., positioned near the bottom of the distribution pole 110). In some embodiments, the one or more components of the HMI 160 included in the control cabinet 125 are components that provide a user with control of one or more components of the switched capacitor bank assembly 105. For example, the control cabinet 125 includes the plurality of input mechanisms (for example, buttons, switches, a touch-screen display, a keyboard, a mouse, and/or the like) for controlling components included in the switched capacitor bank assembly 105. The plurality of input mechanisms included in the control cabinet 125 are used by a service technician to, for example, manually open and/or close the capacitor switches 115A-115C. In some embodiments, the control cabinet 125 also includes a plurality of output mechanisms (for example, a display, a speaker, a touch-screen display, and/or the like) for providing information associated with the switched capacitor bank assembly 105 to a service technician.

The communication module 155 is communicatively connected to the components of the control cabinet 125, such as the capacitor bank controller 150 and the electronic controller 145. The communication module 155 is configured to provide communication between the switched capacitor bank assembly 105 (via the control cabinet 125) and one or more external devices (for example, a smart phone, a tablet, a laptop, etc.). For example, the communication module 155 includes one or more wireless and/or wired transmitters, receivers, and/or transceivers used for communicating with external devices. In some embodiments, the communication module 155 is configured to communicate with external devices operated by a utility service provider and/or a service technician. In such an embodiment, the control cabinet 125 communicates with the one or more external devices through a network. The network may be, for example, a wide area network (WAN) (e.g., the Internet, a TCP/IP based network, a cellular network, such as, for example, a Global System for Mobile Communications [GSM] network, a General Packet Radio Services [GPRS] network, a Code Division Multiple Access [CDMA] network, an Evolution-Data Optimized [EV-DO] network, an Enhanced Data Rates for GSM Evolution [EDGE] network, a 3 GSM network, a 4GSM network, a Digital Enhanced Cordless Telecommunications [DECT] network, a Digital AMPS [IS-136/TDMA] network, or an Integrated Digital Enhanced Network [iDEN] network, etc.). In other embodiments, the network may be, for example, a local area network (LAN), a neighborhood area network (NAN), a home area network (HAN), or personal area network (PAN) employing any of a variety of communications protocols, such as Wi-Fi, Bluetooth (BT), ZigBee, etc. In yet another embodiment, the network includes one or more of a wide area network (WAN), a local area network (LAN), a neighborhood area network (NAN), a home area network (HAN), or personal area network (PAN). In some embodiments, the communication module 155 communicates with one or more peripheral devices in a supervisory control and data acquisition (SCADA) management system.

The switched capacitor bank system 100 also includes one or more wireless current sensors 165A-165C. For example, the wireless current sensors 165A-165C include a first wireless current sensor 165A, a second wireless current sensor 165B, and a third wireless current sensor 165C. The wireless current sensors 165A-165C are attached, and electrically connected, to phase lines 135A-135C, respectively. In particular, the first wireless current sensor 165A is electrically connected to the first phase line 135A. Similarly, the second wireless current sensor 165B is electrically connected to the second phase line 135B. Likewise, the third wireless current sensor 165C is electrically connected to the third phase line 135C. The wireless current sensors 165A-165C are configured to sense current flowing through phase lines 135A-135C, respectively. In some embodiments, the wireless current sensors 165A-165C further include wireless transmitters 170A-170C (for example, antennas). The wireless transmitters 170A-170C transmit current signals indicative of the current flowing through the phase lines 135A-135C, from the wireless current sensors 165A-165C to the electronic controller 145.

In some embodiments, the electronic controller 145 further includes a wireless current sensor module (WCS module) 175. The WCS module 175 receives the current signals transmitted from the wireless transmitters 170A-170C and may perform signal processing on the current signals. The WCS module 175 may be, for example, software instructions stored in memory of the electronic controller 145 that, when executed by the electronic controller 145, perform some or all of the functions of the electronic controller 145. Alternatively, the WCS module 175 may be a combination of software and firmware of the electronic controller 145. The wireless transmitters 170A-170C communicate with the WCS module 175 (e.g., via a wireless transceiver of the WCS module 175) over a range of distances (e.g., up to approximately 1,300 feet). As such, the wireless transmitters 170A-170C are configured to communicate with the WCS module 175 over a long range (LoRa) network (for example, a long range, wide area network (LoRaWAN)). By utilizing the wireless current sensors 165A-165C, the switched capacitor bank system 100 provides long distance communication with minimal interference. In addition, by attaching the wireless current sensors 165A-165C to the phase lines 135A-135C, the wireless current sensors 165A-165C simplify and reduce the cost of installing the switched capacitor bank assembly 105. In some embodiments, current sensor module 175 is a wired current sensor (for example, a line post sensor (such as a line post current sensor) coupled to the electronic controller 145.

Figure 2:
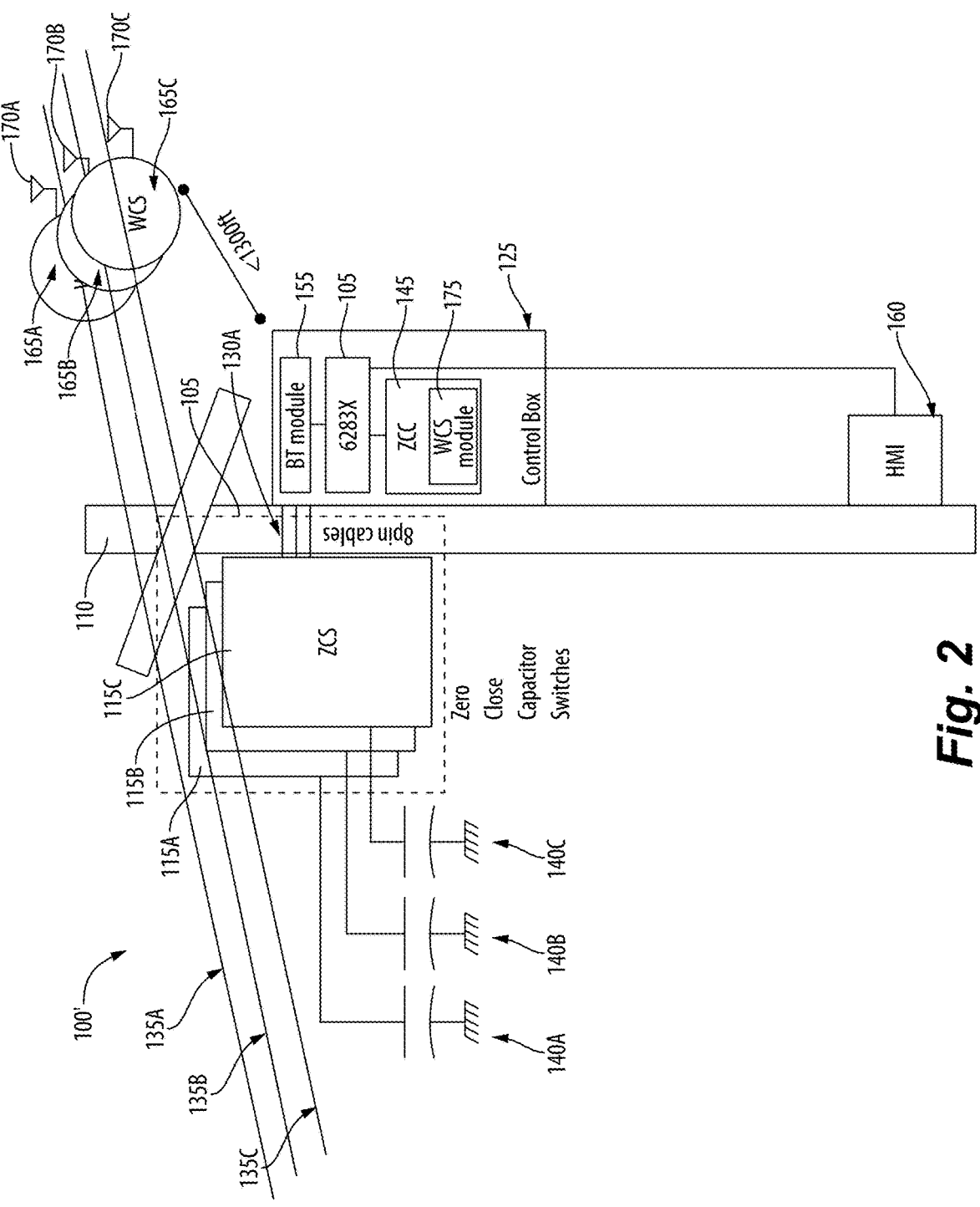
FIG. 2 illustrates a switched capacitor bank system according to some embodiments.

FIG. 2 illustrates an embodiment of a switched capacitor bank system 100' in which the control cabinet 125 is mounted to the distribution pole 110 near (e.g., at an elevation that may be between approximately 30 and 50 feet above ground) the switched capacitor bank assembly 105. As illustrated in FIG. 2, the switched capacitor bank assembly 105 is directly connected to the control cabinet 125 via the switch cables 130A. In addition, the HMI 160 is installed at the bottom of distribution pole 110 for ease of access by a service technician. The embodiment as shown in FIG. 2 includes similar components to the switched capacitor bank system 100 of FIG. 1. Accordingly, it should be understood that the embodiment illustrated in FIG. 2 is configured to perform similar functions to the switch capacitor bank system 100 illustrated in FIG. 1.

Figure 3:
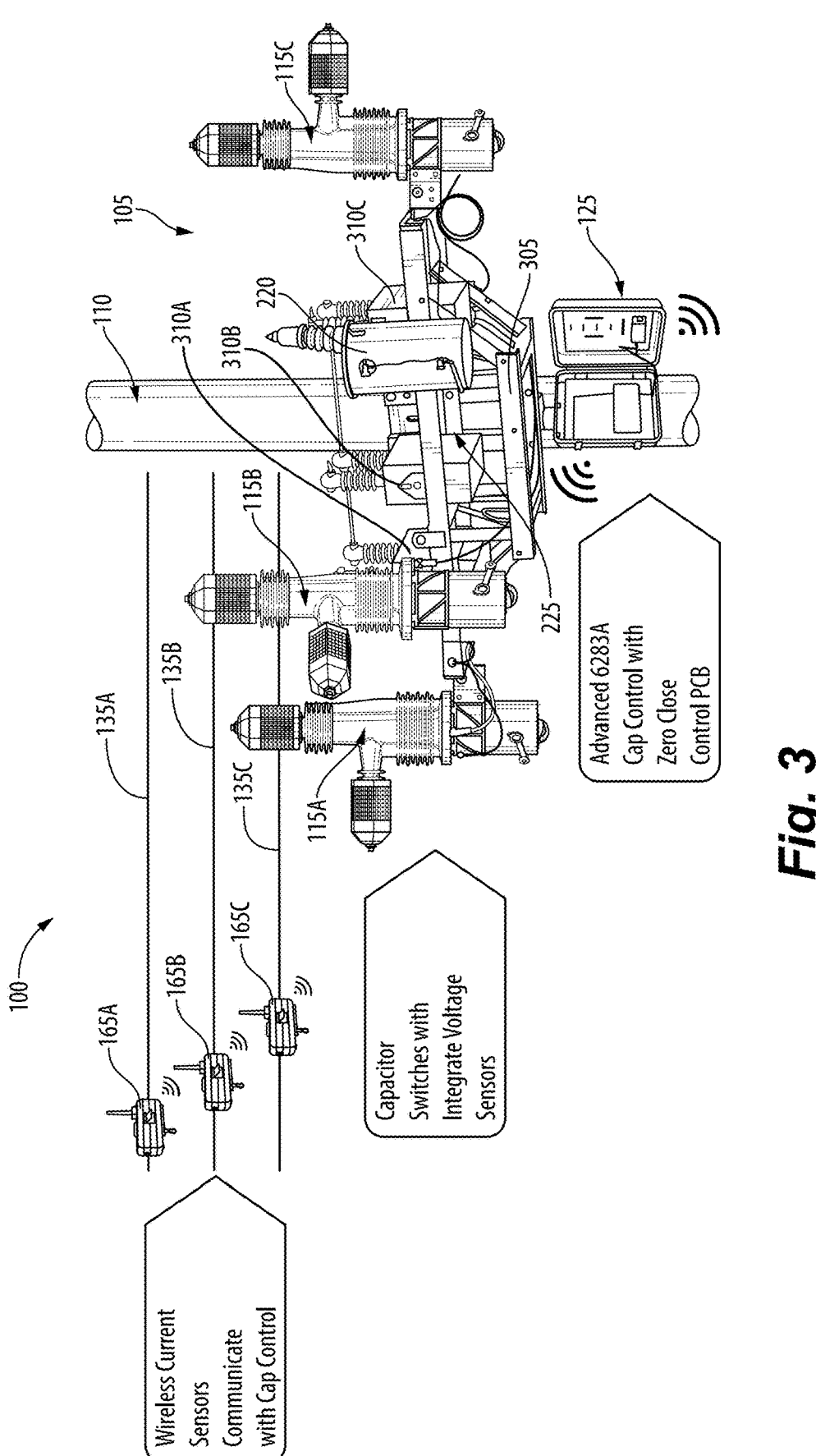
FIG. 3 illustrates a perspective view of the switched capacitor bank system of FIG. 1 or FIG. 2.

FIG. 3 illustrates a perspective view of the switched capacitor bank assembly 105 within the switched capacitor bank system 100 of FIG. 1 or the switched capacitor bank system 100' of FIG. 2, according to some embodiments. As illustrated in FIG. 3, the switched capacitor bank assembly 105 includes a frame 305 that is arranged to physically support the components, such as, but not limited to, capacitors 310A-310C, the capacitor switches 215A-215C, and/or a power transformer 220, included in the switched capacitor bank assembly 105. The frame 305 of the switched capacitor bank assembly 105 may include a combination of brackets, beams, and/or other structural components arranged to physically support the switched capacitor bank assembly 105 and one or more additional arresters. For example, the frame 305 includes an arrester mounting portion 225 to which one or more arresters can be coupled. The frame 305 is further arranged to be physically coupled to the distribution pole 110 by one or more mechanical fasteners such as bolts, screws, and/or rivets. The frame 305 is constructed from various metals, plastics, wood, and/or any suitable combination thereof.

The power transformer 220 is configured to step down the voltage supplied to the switched capacitor bank assembly 105 by the power source to a level sufficient to power the components of the switched capacitor bank assembly 105. Although described above as being a medium voltage distribution network, it should be understood that switched capacitor bank system 100 may be implemented as a high voltage transmission network, a secondary low voltage (e.g., approximately 120 V-240 V) distribution network, and/or any other power distribution network that is desired. Similarly, the power source of the switched capacitor bank assembly 105 may be a three-phase alternating current (AC) power source or any other type of power source.

As briefly described above, when the switched capacitor bank assembly 105 is installed in the switched capacitor bank system 100, each of the capacitors 310A-310C may be selectively connected to the phase lines 135A-135C by the capacitor switches 115A-115C. In particular, a first capacitor 310A is selectively connected between the first phase line 135A and ground 140A-140C (FIG. 1 or FIG. 2) by the first capacitor switch 115A. Similarly, the second capacitor 310B is selectively connected between the second phase line 135B and ground 140A-140C (FIG. 1 or FIG. 2) by the second capacitor switch 115B. Likewise, the third capacitor 310C is selectively connected between the third phase line 135C and ground 140A-140C (FIG. 1 or FIG. 2) by the third capacitor switch 115C. As illustrated in FIG. 3, in some embodiments, each of the capacitors 310A-310C are implemented as the switched capacitor bank assembly 105. In such embodiments, the capacitors 310A-310C are electrically connected in series and/or parallel with one another. In other embodiments, the capacitors 310A-310C are implemented as single capacitors.

In some embodiments, the capacitor switches 115A-115C are implemented as vacuum interrupters. In the such embodiments, the first capacitor switch 115A is implemented as a vacuum interrupter that includes a switching rod and is powered by a solenoid or magnetic actuator mechanism. The solenoid and/or magnetic actuator mechanism is controlled by signals received from the components of the control cabinet 125. As such, each respective capacitor switch 115A-115C may include a solid dielectric housing that encapsulates a respective vacuum interrupter. The solid dielectric switch housing may be formed of an insulating epoxy and/or urethane material.

Figure 4A:
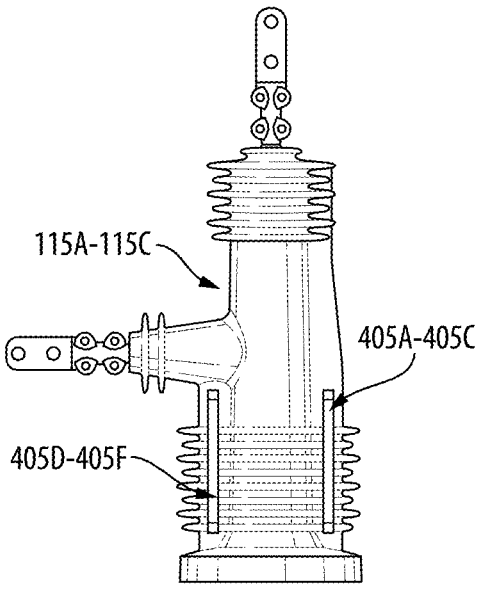
FIGS. 4A-4C illustrate perspective views of a capacitor switch according to some embodiments.
Figure 4B:
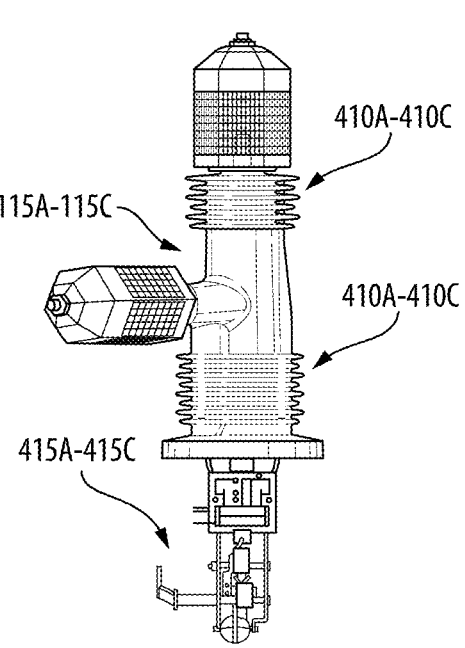
Figure 4C:
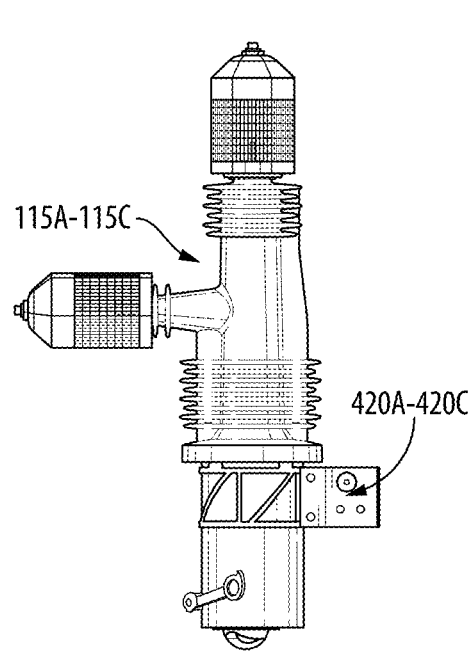

FIGS. 4A-4C illustrate perspective views of a capacitor switch 115 (for example, any one of the capacitor switches 115A-115C), according to some embodiments. As illustrated in FIG. 4A, each capacitor switch 115A-115C includes line voltage sensors 405A-405C and capacitor voltage sensors 405D-405F. In particular, the capacitor voltage sensors 405D-405F are configured to sense a voltage of each respective capacitor 310A-310C. The line voltage sensors 405A-405C are configured to sense the line voltages of each respective phase line 135A-135C. For example, the first capacitor switch 115A includes a first voltage sensor 405A electrically connected in parallel with the first capacitor 310A and first capacitor switch 115A and configured to sense a voltage of the first phase line 135A. The first capacitor switch 115A may also include a second voltage sensor 405D electrically connected to the first capacitor 310A and configured to sense a voltage of the first capacitor 310A. Similarly, the second capacitor switch 115B includes a third voltage sensor 405B electrically connected in parallel with the second capacitor 310B and second capacitor switch 115B and configured to sense a voltage of the second phase line 135B. The second capacitor switch 115B also includes a fourth voltage sensor 405E electrically connected to the second capacitor 310B and configured to sense a voltage of the second capacitor 310B. Likewise, the third capacitor switch 115C includes a fifth voltage sensor 405C electrically connected in parallel with the third capacitor 310C and third capacitor switch 115C and configured to sense a voltage of the third phase line 135C. The third capacitor switch 115C also includes a sixth voltage sensor 405F electrically connected to the third capacitor 310C and configured to sense a voltage of the third capacitor 310C. Although illustrated as three voltage sensors 405A-405C, the system may be configured to operate with more or less voltage sensors (for example, a single voltage sensor 405).

As illustrated in FIG. 4B, the capacitor switches 115A-115C may further include solid dielectric bushings 410A-410C for respectively connecting to phase lines 135A-135C. The solid dielectric bushings 410A-410C are positioned on housings of the capacitor switch 115A-115C and may be formed of the same insulating material as the capacitor switch housings. In some embodiments, the capacitor switches 115A-115C are implemented as other types of switches, such as breakers or relays. Referring back to FIG. 4A, each one of the line voltage sensors 405A-405C and the capacitor voltage sensors 405D-405F may be integrated within the solid dielectric material of the bushings 410A-410C and/or the housings of the capacitor switches 115A-115C as illustrated in FIG. 4B. For example, the line voltage sensors 405A-405C and the capacitor voltage sensors 405D-405F may be embedded within the insulated epoxy resin of the bushings 410A-410C and/or the housing of the capacitor switches 115A-115C.

In some embodiments, the line voltage sensors 405A-405C and the capacitor voltage sensors 405D-405F are implemented as resistor networks configured to sense the respective voltages of capacitors 310A-310C and phase lines 135A-135C. In other embodiments, line voltage sensors 405A-405C and the capacitor voltage sensors 405D-405F are implemented as another type of voltage sensor that can be integrated within the solid dielectric bushing 410A-410C and/or capacitor switch housings. In addition, each capacitor switch 115A-115C includes switching mechanisms 415A-415C as illustrated in FIG. 4B. In particular, the first capacitor switch 115A includes a first switching mechanism 415A electrically connected to the capacitor bank controller 150 and the electronic controller 145. Similarly, the second capacitor switch 115B includes a second switching mechanism 415B electrically connected to the capacitor bank controller 150 and the electronic controller 145. Likewise, the third capacitor switch 115C includes a third switching mechanism 415C electrically connected to the capacitor bank controller 150 and the electronic controller 145. The switching mechanisms 415A-415C are configured to open and/or close the capacitor switches 115A-115C based on a command transmitted from the electronic controller 145. As illustrated in FIG. 4C, in some embodiments, each of the capacitor switches 115A-115C further includes mounting brackets 420A-420C. For example, the first capacitor switch 115A includes a first mounting bracket 420A. Similarly, the second capacitor switch 115B includes a second mounting bracket 420B. Likewise, the third capacitor switch 115C includes a third mounting bracket 420C. The mounting brackets 420A-420C are each affixed to the respective capacitor switch housings and are arranged to physically couple the capacitor switches 115A-115C to the frame 305 by one or more mechanical fasteners such as bolts, screws, and/or rivets.

Figure 5:
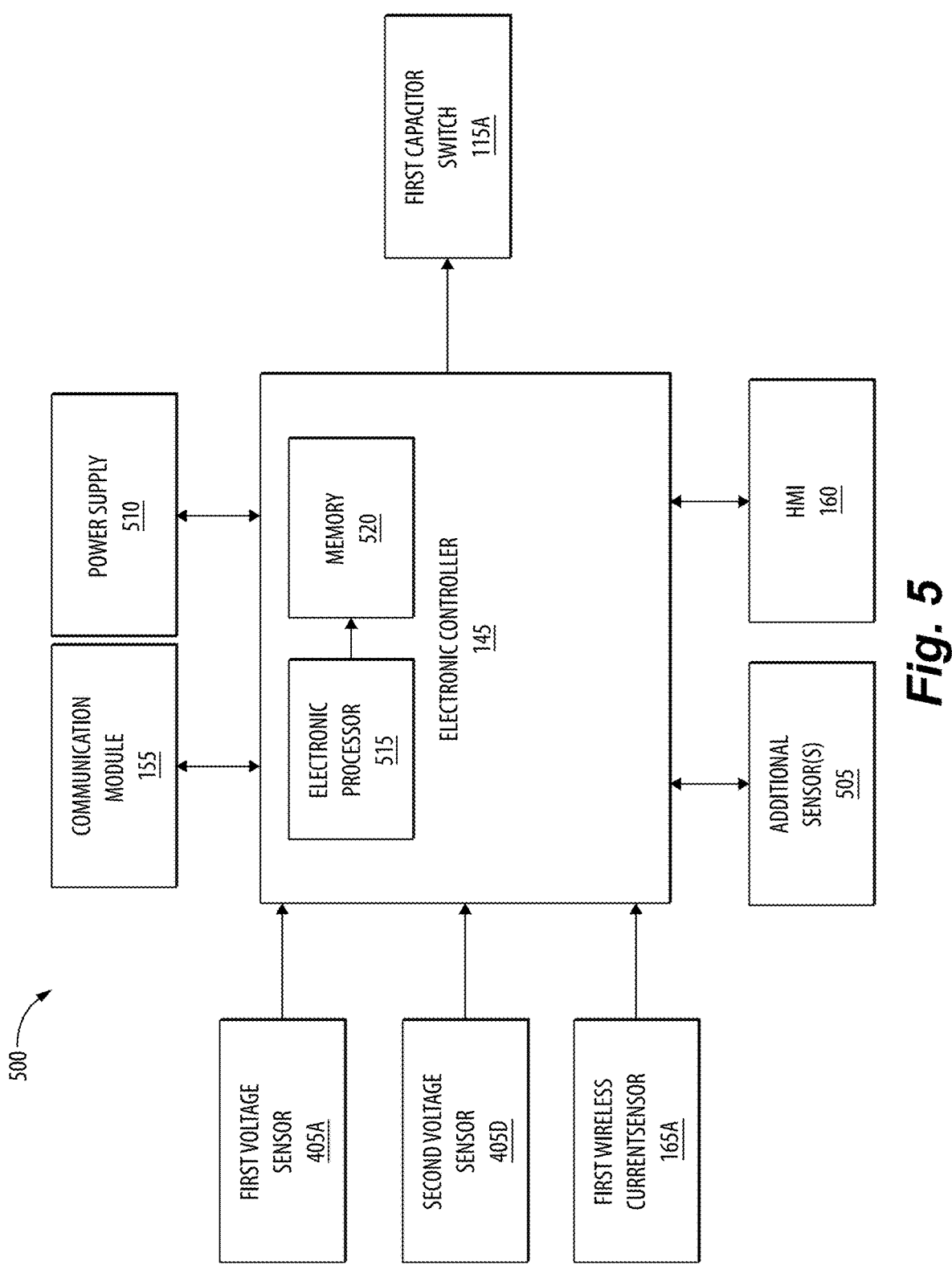
FIG. 5 illustrates a block diagram of a control system of a switched capacitor bank system according to some embodiments.
Figure 6:
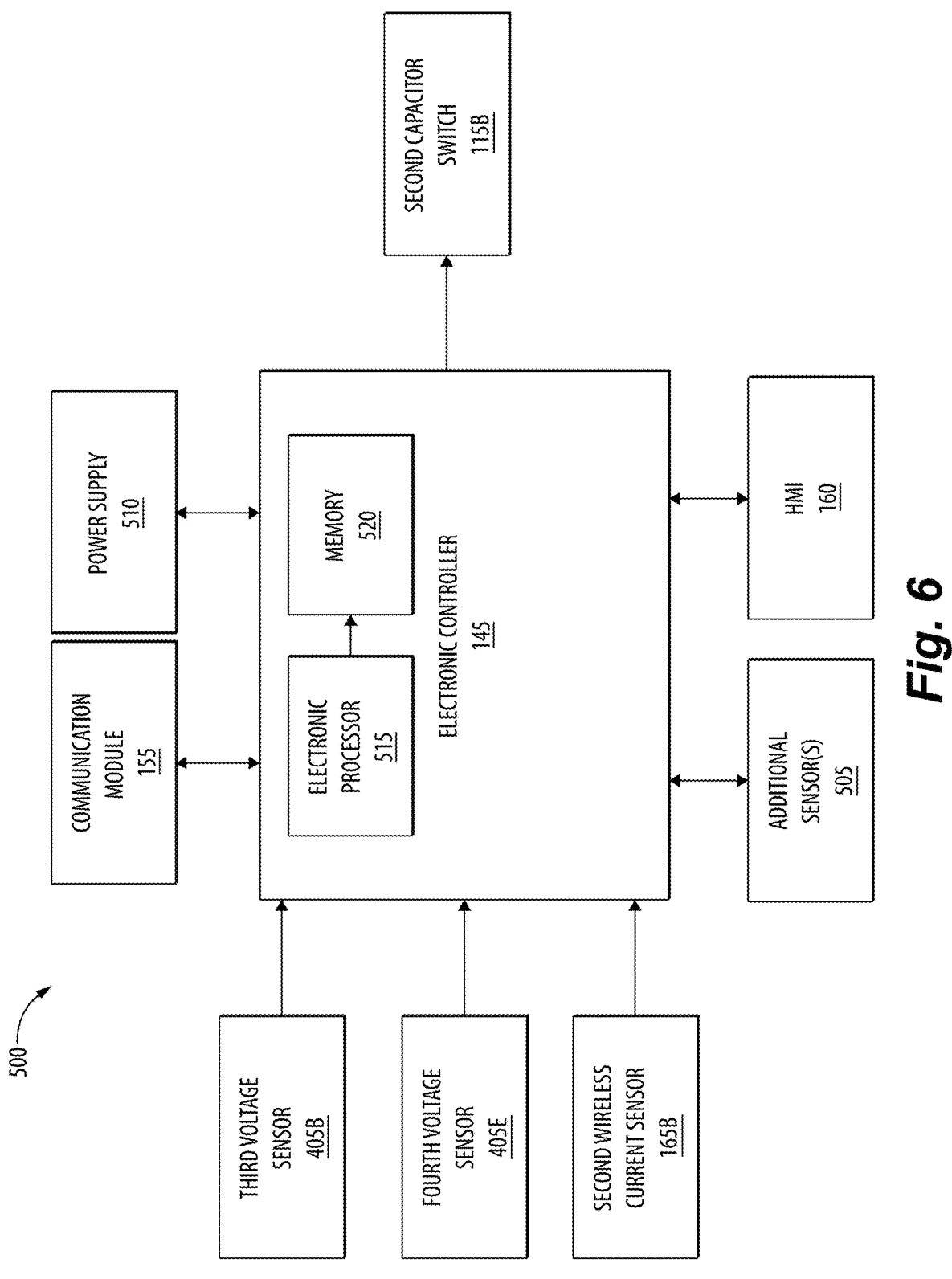
FIG. 6 illustrates a block diagram of a control system of a switched capacitor bank system according to some embodiments.
Figure 7:
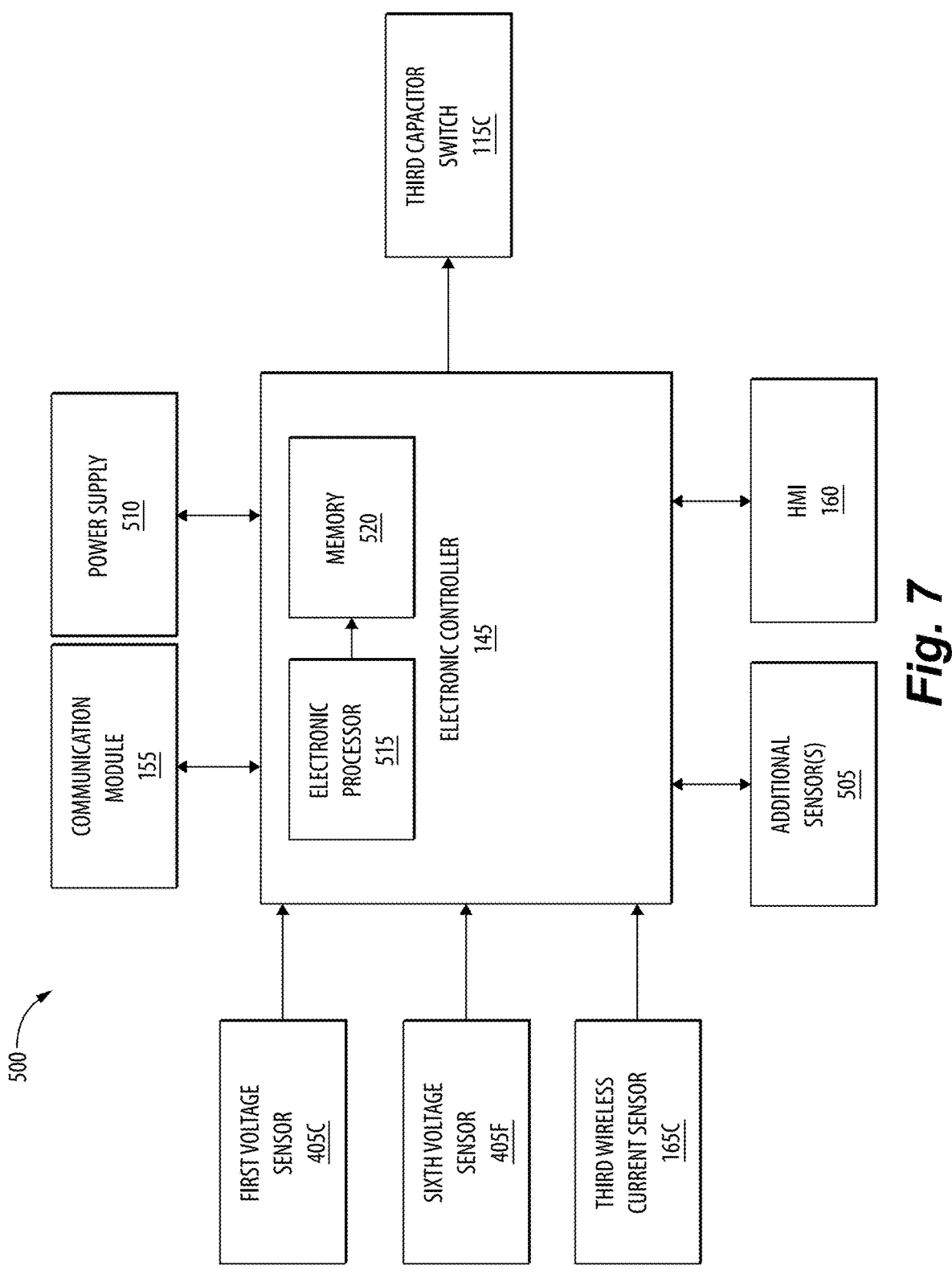
FIG. 7 illustrates a block diagram of a control system of a switched capacitor bank system according to some embodiments.

FIGS. 5-7 illustrate a block diagram of a control system 500 of the switched capacitor bank system 100 or the switched capacitor bank system 100' of FIG. 2, according to some embodiments. The control system 500 includes the electronic controller 145. The electronic controller 145 is electrically and/or communicatively connected to a variety of modules or components of the switched capacitor system 100. As illustrated in FIGS. 5-7, the components of the control system 500 are separated into FIGS. 5, 6, and 7 based on the components corresponding to each respective phase line 135A-135C, for ease of description and illustration. It should be understood that components illustrated in FIGS. 5, 6, and 7 are all a part of the control system 500. For example, the electronic controller 145 is connected to the capacitor switches 115A-115C, the line voltage sensors 405A-405C, the capacitor voltage sensors 405D-405F, the wireless current sensors 165A-165C, the communication module 155, the HMI 160, one or more additional sensors 505, and/or a power supply 510. In some embodiments, the wireless current sensors 165A-165C use Long Range (LoRa) wireless technology.

In some embodiments, the electronic controller 145 is configured to communicate with one or more additional sensors 505. For example, in some embodiments, the one or more additional sensors 505 include one or more temperature sensors, moisture sensors, vibration sensors, and/or other types of sensors used to measure other physical and/or electrical characteristics of the switched capacitor bank system 100. The power supply 510 is configured to selectively provide power to the various components of the switched capacitor bank system 100. In some embodiments, the power supply 510 is configured to power components of the switched capacitor bank system 100 with power received from phase lines 135A-1355C. In such embodiments, the power supply 510 includes one or more AC-AC converters, AC-DC converters, and/or DC-DC converters configured to convert the AC power supplied by phase lines 115A-115C to a desired voltage before it is provided to the various components of the switched capacitor bank system 100. In some embodiments, the power supply 510 includes an internal power source, such as a rechargeable battery or a solar panel, for powering the components of switched capacitor bank assembly 105.

In some embodiments, the electronic controller 145 includes a plurality of electrical and electronic components that provide power, operational control, and/or protection to the components and modules within the electronic controller 145 and/or the switched capacitor bank assembly 105. For example, the electronic controller 145 includes, among other things, an electronic processor 515 (for example, a microprocessor or another suitable programmable device) and a memory 520.

The memory 520 includes, for example, a program storage area and a data storage area. The program storage area and the data storage area can include combinations of different types of memory, such as read-only memory (ROM) and random-access memory (RAM). Various non-transitory computer readable media, for example, magnetic, optical, physical, and/or electronic memory may be used. The electronic processor 515 is communicatively coupled to the memory 520 and executes software instructions that are stored in the memory 520, or stored in another non-transitory computer readable medium such as another memory or a disc. The software may include one or more applications, program data, filters, rules, one or more program modules, and other executable instructions. In some embodiments, the memory 520 includes one or more modules configured to perform various functions of electronic controller 145. For example, the memory 520 may include a voltage comparison program used for analyzing voltages received from the line voltage sensors 405A-405C and the capacitor voltage sensors 405D-405F. In addition, the memory 520 may also include a phase shift calculation program used for determining phase shifts of the phase lines 135A-135C based on the currents received from the wireless current sensors 165A-165C. The memory 520 may additionally or alternatively include a switch control module configured to generate signals (e.g., close and/or open signals) to instruct the capacitor switches 115A-115C to open or close.

During operation of the switched capacitor bank system 100, the controller 145 receives phase line voltage signals from the line voltage sensors 405A-405C and capacitor voltage signals from the capacitor voltage sensors 405D-405F. The electronic controller 145 is configured to determine the magnitude, phase, and/or frequency of the capacitor voltages and the phase line voltages based on the received capacitor and line voltage signals. The electronic controller 145 may also generate a timestamp (e.g., a time of day) associated with the magnitude, phase, and/or frequency of the capacitor voltages and the phase line voltages. For example, the electronic controller 145 may include a global positioning system (GPS) receiver that generates the timestamp associated with each magnitude, phase, and/or frequency based on when the capacitor voltage signals and the line voltage signals are received by the electronic controller 145. The electronic controller 145 may use the timestamp to control simultaneity between components of the switched capacitor bank system 100 and corresponding determinations. Thus, the electronic controller 145 makes determinations using signals including the same timestamp. As such, the electronic controller 145 controls the timing of switching operations (e.g., opening and/or closing capacitor switches 115A-115C) based on determinations made from the same timestamp.

The electronic controller 145 also receives current signals from the wireless current sensors 165A-165C. For example, the wireless current sensors 165A-165C transmit the current signals via the wireless transmitters 170A-170C. The electronic controller 145 may receive the current signals via the WCS module 175. In some embodiments, the wireless current sensors 165A-165C each include an electronic processor configured to collect current data based on the sensed current of the respective phase lines 135A-135C. In such embodiments, the wireless current sensors 165A-165C may determine the current data by calculating a discrete Fourier transform (DFT) of the sensed current via the electronic processor of each of the wireless current sensors 165A-165C. The wireless current sensors 165A-165C may also calculate a fast Fourier transform (FFT) of the determined current data via the electronic processor. In some embodiments, the wireless current sensors 165A-165C transmit results of the FFT as the current signals to the electronic controller 145 via the wireless transmitters 170A-170C, respectively. By collecting and processing the current data, the wireless current sensors 165A-165C limit the amount of data transmitted via the current signals. Accordingly, the wireless current sensors 165A-165C may require less power to operate than existing wired current sensors. In addition, when the electronic controller 145 receives the current signals, the electronic controller 145 may be configured to determine the magnitude and phase of the phase line currents over a number of current cycles (e.g., approximately 10-12 current cycles) based on the received current signals. Similar to the capacitor voltages and phase line voltages described above, the electronic controller 145 may also generate the timestamp (via the GPS receiver) associated with the magnitude and phase of the current signals based on when the current signals are received by the electronic controller 145. In other embodiments, each electronic processor of the wireless current sensors 165A-165C includes a GPS to generate the timestamp associated with the magnitude and phase of the current signals.

Referring back to the embodiment of FIG. 5, for example, the electronic controller 145 is configured to determine the magnitude, phase, and/or frequency of the voltage across the first capacitor 310A based on voltage signals received from the second voltage sensor 405D. Similarly, the electronic controller 145 is configured to determine the magnitude, phase, and/or frequency of the voltage of the first phase line 135A based on voltage signals received from the first voltage sensor 405A. The electronic controller 145 may also be configured to determine the magnitude and/or the phase of the current flowing through the first phase line 135A based on the current signals received from the first wireless current sensor 165A.

Referring now to the embodiment of FIG. 6, the electronic controller 145 is configured to determine the magnitude, phase, and/or frequency of the voltage across the second capacitor 310B based on voltage signals received from the fourth voltage sensor 405E. Similarly, the electronic controller 145 may be configured to determine the magnitude, phase, and/or frequency of the voltage of the second phase line 135B based on voltage signals received from the third voltage sensor 405B. The electronic controller 145 may also be configured to determine the magnitude and/or the phase of the current flowing through the second phase line 135B based on the current signals received from the second wireless current sensor 165B.

Moving on to the embodiment of FIG. 7, the electronic controller 145 is configured to determine the magnitude, phase, and/or frequency of the voltage across the third capacitor 310C based on voltage signals received from the sixth voltage sensor 405F. Similarly, the electronic controller 145 may be configured to determine the magnitude, phase, and/or frequency of the voltage of the third phase line 135C based on voltage signals received from the third voltage sensor 405B. The electronic controller 145 may also be configured to determine the magnitude and/or the phase of the current flowing through the third phase line 135C based on the current signals received from the third wireless current sensor 165C.

With reference to FIGS. 5-7, the electronic controller 145 may further be configured to determine whether to open or close the capacitor switches 115A-115C based on the determined voltage of the capacitors 310A-310C, the determined voltages of the phase lines 135A-135C, and/or the determined current of the phase lines 135A-135C. During operation, the capacitor switches 115A-115C are normally open. However, the electronic controller 145 is configured to close one or more of the capacitor switches 115A-115C in response to determining that the phase line voltages are unbalanced and/or not in phase with one another.

Figure 8:
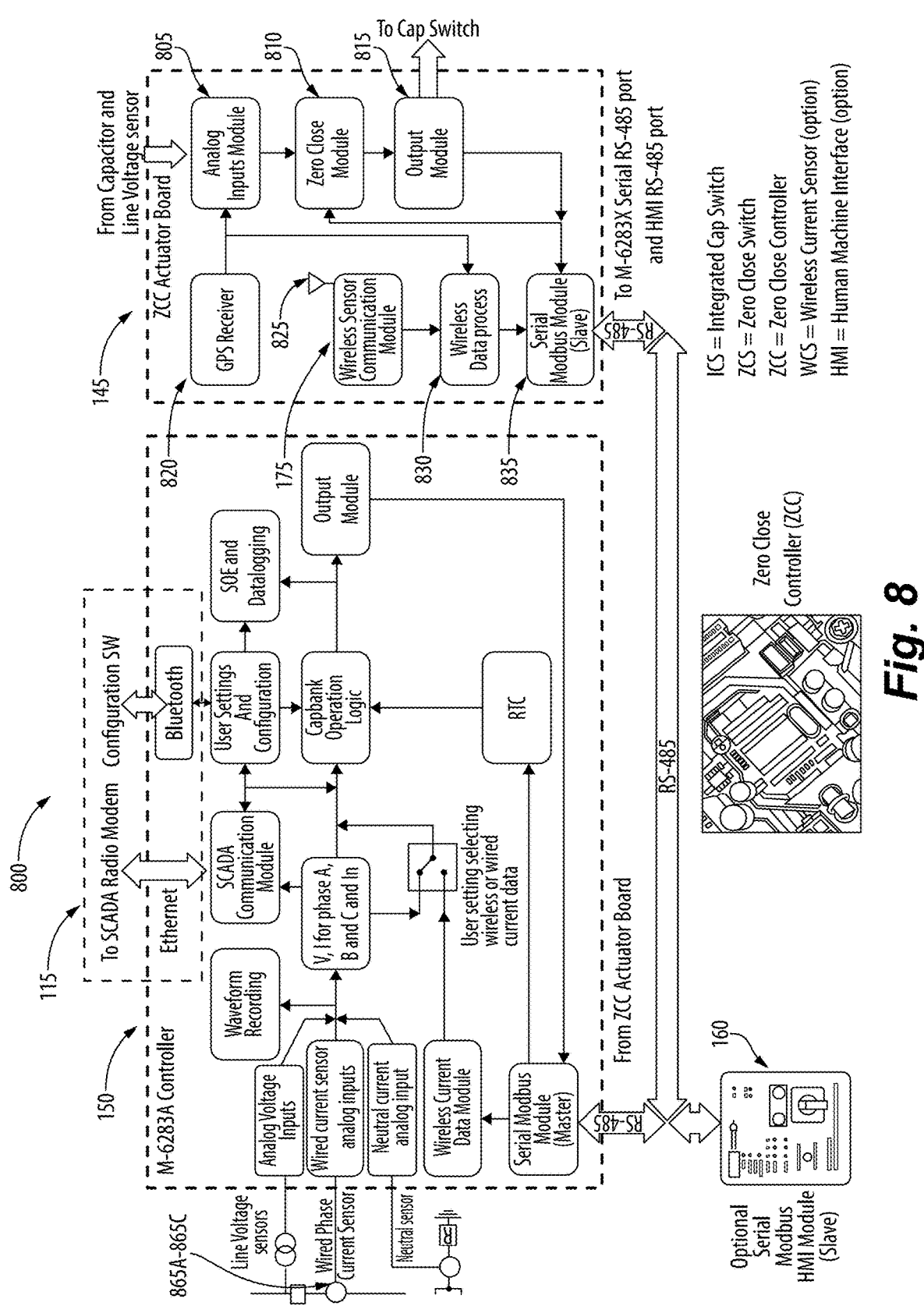
FIG. 8 illustrates a block diagram of a control system of a switched capacitor bank system according to some embodiments.
Figure 9:
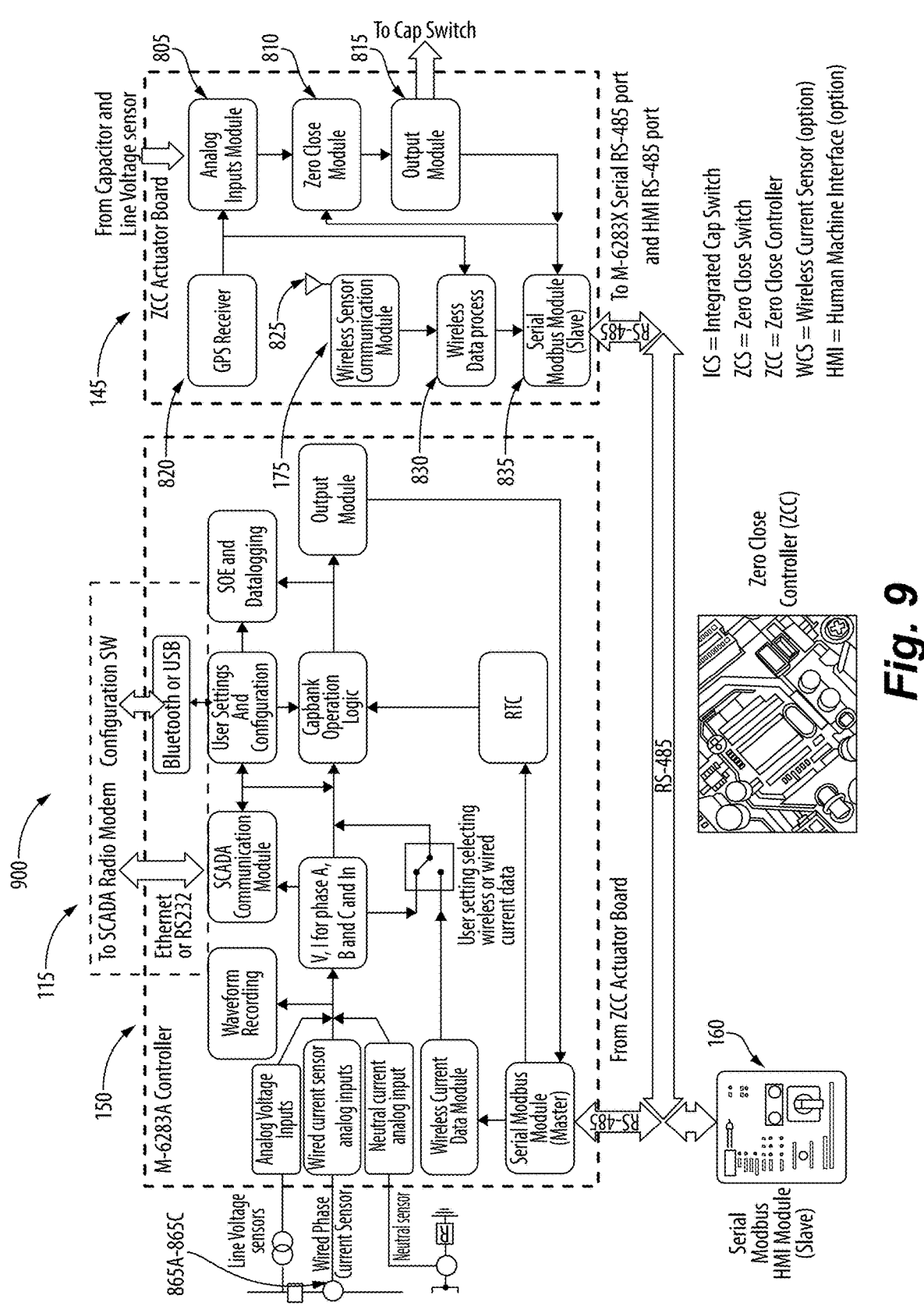
FIG. 9 illustrates a block diagram of a control system of a switched capacitor bank system according to some embodiments.

FIGS. 8 and 9 illustrate block diagrams of an example control system 800 and an example control system 900, respectively, of the switched capacitor bank system 100 or the switched capacitor bank system 100' of FIG. 2, according to some embodiments. In some embodiments, the control system 800 is a top pole configuration. In some embodiments, the control system 900 is a down pole configuration. It should be understood that the control systems 800, 900 include similar components to the control system 500 and the switched capacitor bank system 100. For example, as illustrated in FIGS. 8 and 9, the control systems 800, 900 include the electronic controller 145, the capacitor bank controller 150, and the HMI 160. The electronic controller 145 and the capacitor bank controller 150 may each include a variety of modules or components configured to perform signal processing in accordance with embodiments described herein. In some embodiments, the control systems 800, 900 may further include wired current sensors 865A-865C, in which each of the wired current sensors 865A-865C corresponding to respective phase lines 135A-135C. The wired current sensors 865A-865C may be positioned atop the distribution pole 110 and electrically connected to the capacitor bank controller 150 via one or more sensor cables. In such embodiments, the wired current sensors 865A-865C are also configured to sense current flowing through phase lines 135A-135C and transmit current signals indicative of the sensed current to the capacitor bank controller 150. Additionally, the capacitor bank controller 150 may receive one or more user inputs indicative of selecting wired current signals or wireless current signals for use in signal processing. The one or more user inputs may be received from one or more of the plurality of input mechanisms of the HMI 160.

As illustrated in FIGS. 8 and 9, the capacitor bank controller 150 is configured to communicate with one or more external devices via the communication module 155, as described above. The electronic controller 145 may also include an analog inputs module 805, a zero close module 810, an output module 815, a GPS receiver 820 (e.g., a GPS receiver as described above with reference to FIGS. 5-7), the WCS module 175, a wireless transceiver 825 (e.g., a wireless transceiver) as described above with reference to FIGS. 5-7) communicatively connected to the WCS module 175, a wireless data processing module 830, and a serial modbus module 835. The analog inputs module 805 is communicatively connected to the line voltage sensors 405A-405C and the capacitor voltage sensors 405D-405F. In some embodiments, the analog inputs module 805 is configured to receive the line voltage signals and the capacitor voltage signals from the line voltage sensors 405A-405C and the capacitor voltage sensors 405D-405F, respectively. The analog inputs module 805 may also be communicatively connected to the GPS receiver 820 such that the analog inputs module 805 is configured to receive the timestamp generated by the GPS receiver 820. As described above, the WCS module 175 receives the current signals transmitted from the wireless transmitters 170A-170C via the wireless transceiver 825. The wireless data processing module 830 is communicatively connected to the WCS module 175 and the GPS receiver 820. In some embodiments, the wireless data processing module 830 is configured to receive the current signals and the timestamp from the WCS module 175 and the GPS receiver 820. In response to the wireless data processing module 830 receiving the current signals and the timestamp, the wireless data processing module 830 may process the current signals to collect the current data in a similar manner to as described above with reference to the wireless current sensors 165A-165C with reference to FIG. 5.

In addition, the zero close module 810 may be configured to receive the processed current signals from the wireless data processing module 830 and the line voltage signals and the capacitor voltage signals from the line voltage sensors 405A-405C and the capacitor voltage sensors 405D-405F, respectively. When the zero close module 810 receives the processed current signals, the capacitor voltage signals, and the line voltage signals, the zero close module 810 may be configured to perform zero close control to monitor voltage and/or current of the switched capacitor bank system 100 in accordance with the methods described herein (for example, the methods as described below with reference to FIG. 10). The zero close module 810 may transmit a command to open and/or close the capacitor switches 115A-115C. In some embodiments, the zero close module 810 transmits the command to open and/or close the capacitor switches 115A-115C directly via the output module 815 to the capacitor switches 115A-115C. In other embodiments, the zero close module 810 transmits the command to open and/or close the capacitor switches 115A-115C indirectly via the serial modbus module 835 to the capacitor bank controller 150 and the HMI 160. In such embodiments, the capacitor bank controller 150 may transmit the command to open and/or close the capacitor switches 115A-115C.

Figure 10:
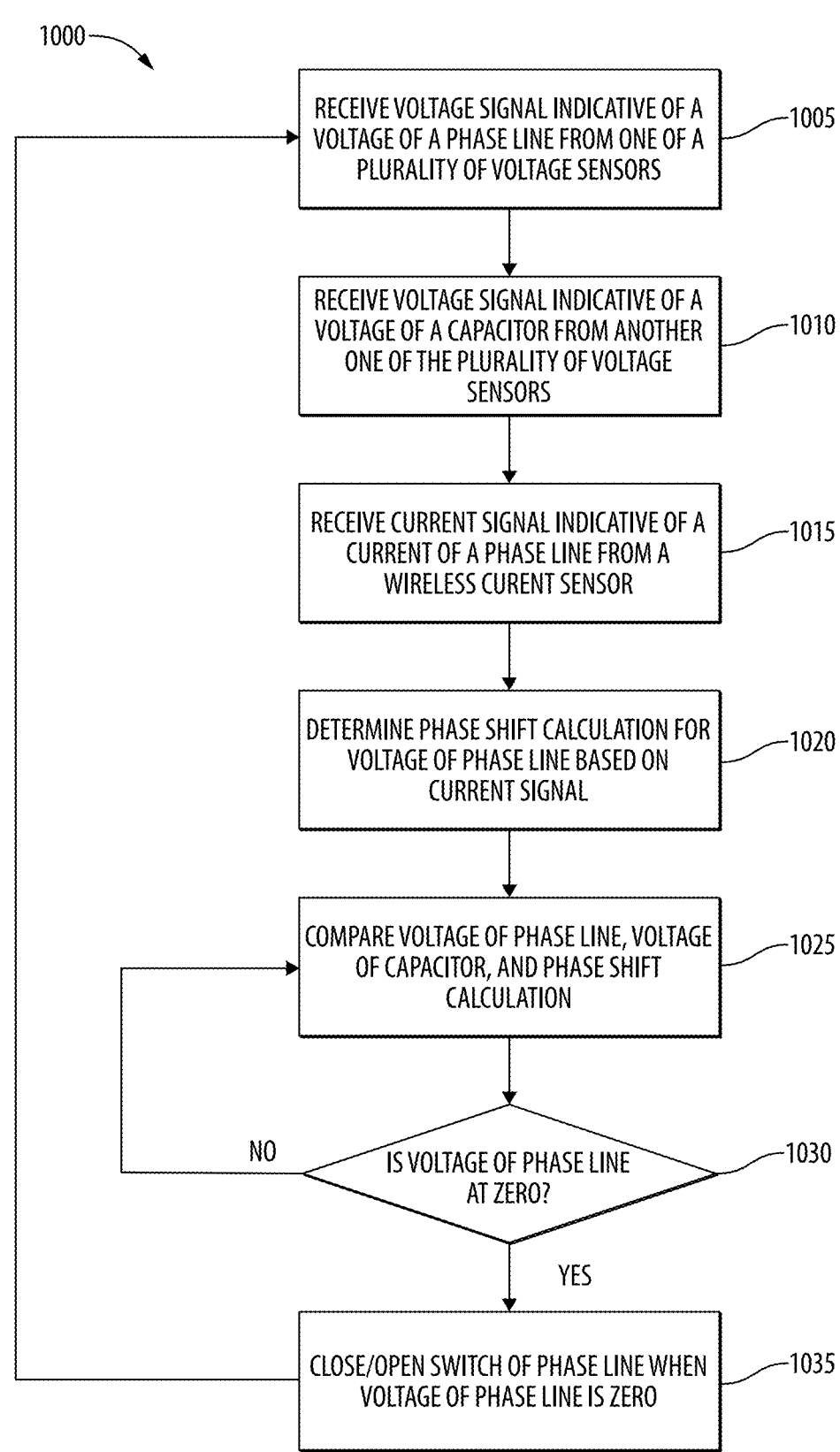
FIG. 10 is a flowchart of a method for controlling a switched capacitor bank system according to some embodiments.

FIG. 10 illustrates a method 1000 for controlling a switched capacitor bank system 100 or the switched capacitor bank system 100' of FIG. 2 (e.g., via zero close control), according to some embodiments. It should be understood that the order of the steps disclosed in method 1000 could vary. Although illustrated as occurring in serial order, in other embodiments, the steps disclosed may be performed in parallel order. Furthermore, additional steps may be added to the process and not all of the steps may be required.

Timing accuracy between monitored voltage and/or current signals of the switched capacitor bank system 100 can be useful for determining when to open and/or close the capacitor switches 115A-115C. Opening and/or closing the capacitor switches 115A-115C when associated loads are not in phase may introduce transmission losses to the switched capacitor bank system 100, increased loading on components of the switched capacitor bank system 100, and reduce the lifespan of the capacitor switches 115A-115C. By monitoring the voltage across the capacitors 310A-310C, the voltage of the phase lines 135A-135C, and the current flowing through the phase lines 135A-135C during a period of time, the switched capacitor bank system 100 can allow for more precise control of opening and/or closing the capacitor switches 115A-115C when loading of the phase lines 135A-135C is balanced with the loading of the switched capacitor bank assembly 105. Further, by determining a more precise timing to open and/or close the capacitor switches 115A-115C, the switched capacitor bank system 100 can experience improved capacitor switch 115A-115C and capacitor 310A-310C lifespan and reducing component failures and maintenance costs associated with increased loading of components.

Turning now to FIG. 10, the method 1000 for controlling a switched capacitor bank system 100 is shown, according to some embodiments. In one embodiment, the method 1000 is performed by an electronic controller, such as the electronic controller 145. However, in other embodiments, the method 1000 may be performed via other components within the switched capacitor bank system 100, such as the capacitor bank controller 150, or a combination of the electronic controller 145 and the capacitor bank controller 150.

At step 1005, the electronic controller 145 receives voltage signals (e.g., line voltage signals) indicative of a voltage of each phase lines 135A-135C from the line voltage sensors 405A-405C at a timestamp based on the GPS receiver 820. In some embodiments, the electronic controller 145 receives a first voltage signal indicative of the voltage of the first phase line 135A from the first voltage sensor 405A. At step 1010, the electronic controller 145 receives voltage signals (e.g., capacitor voltage signals) indicative of a voltage across each of the capacitors 310A-310C from the capacitor voltage sensors 405D-405F at the timestamp. In some embodiments, the electronic controller 145 receives a second voltage signal indicative of the voltage of the first capacitor 310A from the second voltage sensor 405D. At step 1015, the electronic controller receives current signals indicative of a current flowing through each of the phase lines 135A-135C at the timestamp. In some embodiments, the electronic controller 145 receives a first current signal indicative of the current of the first phase line 135A from the first wireless current sensor 165A.

Although steps 1005-1015 are described with respect to the first phase line 135A and the first capacitor 310A, similar method steps occur with respect to the second phase line 135B, the second capacitor 310B, the third phase line 135C, and the third capacitor 310C at the timestamp. For example, at step 1005, the electronic controller 145 receives a third voltage signal indicative of the voltage of the second phase line 135B from the third voltage sensor 405B. At step 1010, the electronic controller 145 receives a fourth voltage signal indicative of the voltage of the second capacitor 310B from the fourth voltage sensor 405E. At step 1015, the electronic controller 145 receives a second current signal indicative of the current of the second phase line 135B from the second wireless current sensor 165B. Likewise, at step 1005, the electronic controller 145 receives a fifth voltage signal indicative of the voltage of the third phase line 135C from the fifth voltage sensor 405C. At step 1010, the electronic controller 145 receives a sixth voltage signal indicative of the voltage of the third capacitor 310C from the sixth voltage sensor 405F. At step 1015, the electronic controller 145 receives a third current signal indicative of the current of the third phase line 135C from the third wireless current sensor 165C.

Moving on to step 1020, the electronic controller 145 determines a phase shift calculation for each voltage of respective phase lines 135A-135C based on the current signals. For example, if the electronic controller 145 determines a phase shift in any of the voltages of respective phase lines 135A-135C, the phase shift may be indicative of a delay in when the voltage signal was received compared to the timestamp (e.g., one or more voltage signals of the respective phase lines 135A-135C is delayed). In some instances, the electronic controller 145 determines a phase shift of zero. As such, the electronic controller 145 may determine the phase shift calculation by comparing the magnitude and the phase of the current signal and the magnitude and the phase of the line voltage signal at the timestamp. In instances where the electronic controller 145 determines a phase shift, the electronic controller 145 may correct the voltage of the respective phase line 135A-135B by the respective phase shift calculation. In some embodiments, the electronic controller 145 determines a first phase shift calculation for the voltage of the first phase line 135A based on the first current signal. The electronic controller 145 determines a second phase shift calculation for the voltage of the second phase line 135B based on the second current signal. The electronic controller 145 also determines a third phase shift calculation for the voltage of the third phase line 135C based on the third current signal.

At step 1025, the electronic controller 145 compares each capacitor voltage signal to each respective line voltage signal including any phase shift calculation adjustment. For example, the electronic controller 145 compares the first voltage signal to the second voltage signal, the third voltage signal to the fourth voltage signal, and the fifth voltage signal to the sixth voltage signal. At step 1030, the electronic controller 145 determines when the line voltage of any of the phase lines 135A-135C is at zero volts based on the comparison of step 1025. For example, the electronic controller 145 determines that the line voltage of any of the phase lines 135A-135C is zero volts when the difference between the capacitor voltage signal and the line voltage signal with any phase shift calculation of the respective phase lines 135A-135C is zero volts. In some embodiments, the electronic controller 145 determines when the voltage of the first phase line 135A is at zero by comparing the first voltage signal, the second voltage signal, and the first phase shift calculation. The electronic controller 145 determines when the voltage of the second phase line 135B is at zero by comparing the third voltage signal, the fourth voltage signal, and the second phase shift calculation. The electronic controller 145 also determines when the voltage of the third phase line 135C is at zero by comparing the fifth voltage signal, the sixth voltage signal, and the third phase shift calculation. When the electronic controller 145 determines that the line voltage of any of the phase lines 135A-135C is not at zero volts, the method 1000 returns to step 1025.

At step 1035, when the electronic controller 145 determines that the line voltage of any of the phase lines 135A-135C is at zero volts, the electronic controller 145 transmits a command to close the corresponding capacitor switch 115A-115C of the respective phase line 135A-135C that was determined to be zero volts. For example, the electronic controller 145 closes the first capacitor switch 115A when the voltage of the first phase line 135A is at zero. Similarly, the electronic controller 145 closes the second capacitor switch 115B when the voltage of the second phase line 135B is at zero. Likewise, the electronic controller 145 closes the third capacitor switch 115C when the voltage of the third phase line 135C is at zero. It should be understood that once the electronic controller 145 closes any of the capacitor switches 115A-115C, the method 1000 may return to step 1005 and repeat steps 1005-1035 to open any of the capacitor switches 115A-115C. Accordingly, the method 1000 may repeat indefinitely as long as the switched capacitor bank assembly 105 remains in operation.

In some embodiments, the electronic controller 145 is further configured to determine a time period between previous capacitor switch closing operations and closing the capacitor switches 115A-115C at step 1035. For example, the electronic controller 145 determines the time period between completing subsequent opening/closing operations. The electronic controller 145 may determine a first time period between previous first capacitor switch closing operations and closing the first capacitor switch 115A at step 1035. Similarly, the electronic controller 145 may determine a second time period between previous second capacitor switch closing operations and closing the second capacitor switch 115B at step 1035. Likewise, the electronic controller 145 may determine a third time period between previous third capacitor switch closing operations and closing the third capacitor switch 115C at step 1035. In some embodiments, the electronic controller 145 is configured to compare the time period for each of the capacitor switches 115A-115C to previous time periods for the respective capacitor switches 115A-115C. For example, the electronic controller 145 compares the first time period to previous time periods between previous first capacitor switch closing operations, the second time period to previous time periods between previous second capacitor switch closing operations, and the third time period to previous time periods between previous third capacitor switch closing operations. Based on the comparisons, the electronic controller 145 determines a corresponding time delay for opening/closing each of the capacitor switches 115A-115C at subsequent close operations. For example, the electronic controller 145 determines a first time delay for opening/closing the first capacitor switch 115A, a second time delay for opening/closing the second capacitor switch 115B, and a third time delay for opening/closing the third capacitor switch 115C.

Thus, the disclosure provides, among other things, a switched capacitor bank system. Various features and advantages of the various embodiments disclosed herein are set forth in the following claims. In the foregoing specification, specific examples, features, and aspects have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A switched capacitor bank system comprising:
   a switched capacitor bank assembly including a first capacitor;
   a first switch selectively connected between the first capacitor and a first phase line;
   a first voltage sensor integrated within a housing of the first switch and configured to sense a voltage of the first phase line;
   a second voltage sensor integrated within the housing of the first switch and configured to sense a voltage of the first capacitor;
   a frame arranged to physically support the first capacitor, the first switch, the first voltage sensor, and the second voltage sensor;
   a first wireless current sensor attached to the first phase line and configured to sense a current of the first phase line; and
   an electronic controller including an electronic processor, the electronic controller operably coupled to the first switch, the first voltage sensor, the second voltage sensor, the first wireless current sensor, and configured to:
      receive a first voltage signal indicative of the voltage of the first phase line from the first voltage sensor;
      receive a second voltage signal indicative of the voltage of the first capacitor from the second voltage sensor;
      receive a first current signal indicative of the current of the first phase line from the first wireless current sensor;
      determine a first phase shift calculation for the voltage of the first phase line based on the first current signal;
      determine when the voltage of the first phase line is at zero by comparing the first voltage signal, the second voltage signal, and the first phase shift calculation; and
      close the first switch when the voltage of the first phase line is at zero.

2. The switched capacitor bank system of claim 1, wherein the frame includes an arrester mounting portion.

3. The switched capacitor bank system of claim 1, wherein the frame is mounted to a distribution pole.

4. The switched capacitor bank system of claim 1, further comprising:
   a second capacitor physically supported by the frame;
   a second switch selectively connected between the second capacitor and a second phase line, the second switch being physically supported by the frame;
   a third voltage sensor integrated within a housing of the second switch and configured to sense a voltage of the second phase line;
   a fourth voltage sensor integrated within the housing of the second switch and configured to sense a voltage of the second capacitor; and
   a second wireless current sensor attached to the second phase line and configured to sense a current of the second phase line,
      wherein the electronic controller is operably coupled to the second switch, the third voltage sensor, the fourth voltage sensor, and the second wireless current sensor.

5. The switched capacitor bank system of claim 4, wherein the electronic controller is further configured to:
   receive a third voltage signal indicative of the voltage of the second phase line from the third voltage sensor;
   receive a fourth voltage signal indicative of the voltage of the second capacitor from the fourth voltage sensor;
   receive a second current signal indicative of the current of the second phase line from the second wireless current sensor;

determine a second phase shift calculation for the voltage of the second phase line based on the second current signal;

determine when the voltage of the second phase line is at zero by comparing the third voltage signal, the fourth voltage signal, and the second phase shift calculation; and close the second switch when the voltage of the second phase line is at zero.

6. The switched capacitor bank system of claim 5, further comprising:

a third capacitor physically supported by the frame;

a third switch selectively connected between the third capacitor and a third phase line, the third switch being physically supported by the frame;

a fifth voltage sensor integrated within a housing of the third switch and configured to sense a voltage of the third phase line;

a sixth voltage sensor integrated within the housing of the third switch and configured to sense a voltage of the third capacitor; and a third wireless current sensor attached to the third phase line and configured to sense a current of the third phase line, wherein the electronic controller is operably coupled to the third switch, the fifth voltage sensor, the sixth voltage sensor, and the third wireless current sensor.

7. The switched capacitor bank system of claim 6, wherein the electronic controller is further configured to:

receive a fifth voltage signal indicative of the voltage of the third phase line from the fifth voltage sensor;

receive a sixth voltage signal indicative of the voltage of the third capacitor from the sixth voltage sensor;

receive a third current signal indicative of the current of the third phase line from the third wireless current sensor;

determine a third phase shift calculation for the voltage of the third phase line based on the third current signal;

determine when the voltage of the third phase line is at zero by comparing the fifth voltage signal, the sixth voltage signal, and the third phase shift calculation; and close the third switch when the voltage of the third phase line is at zero.

8. The switched capacitor bank system of claim 7, wherein the first current signal includes a phase and a magnitude of the current of the first phase line, the second current signal includes a phase and a magnitude of the current of the second phase line, and the third current signal includes a phase and a magnitude of the current of the third phase line.

9. The switched capacitor bank system of claim 1, wherein the electronic controller is further configured to:

determine a time period between previous first switch closing operations and closing the first switch;

compare the time period to previous time periods for previous first switch closing operations; and determine a time delay for closing the first switch at subsequent closing operations.

10. A method for controlling a switched capacitor bank system, the switched capacitor bank system including a switched capacitor bank assembly having a first capacitor, a first switch selectively connected between the first capacitor and a first phase line, a first voltage sensor integrated within a housing of the first switch and configured to sense a voltage of the first phase line, a second voltage sensor integrated within the housing of the first switch and configured to sense a voltage of the first capacitor, and a frame arranged to physically support the first capacitor, the first switch, the first voltage sensor, and the second voltage sensor, the switched capacitor bank system also including a first wireless current sensor attached to the first phase line and configured to sense a current of the first phase line and an electronic controller including an electronic processor, the electronic controller operably coupled to the first switch, the first voltage sensor, the second voltage sensor, the first wireless current sensor, the method comprising:

receiving, via the electronic controller, a first voltage signal indicative of the voltage of the first phase line from the first voltage sensor;

receiving, via the electronic controller, a second voltage signal indicative of the voltage of the first capacitor from the second voltage sensor;

receiving, via the electronic controller, a first current signal indicative of the current of the first phase line from the first wireless current sensor;

determining, via the electronic controller, a first phase shift calculation for the voltage of the first phase line based on the first current signal;

determining, via the electronic controller, when the voltage of the first phase line is at zero by comparing the first voltage signal, the second voltage signal, and the first phase shift calculation; and transmitting, via the electronic controller, a command to close the first switch when the voltage of the first phase line is at zero.

11. The method of claim 10, the switched capacitor bank system further comprising:

a second capacitor physically supported by the frame;

a second switch selectively connected between the second capacitor and a second phase line, the second switch being physically supported by the frame;

a third voltage sensor integrated within a housing of the second switch and configured to sense a voltage of the second phase line;

a fourth voltage sensor integrated within the housing of the second switch and configured to sense a voltage of the second capacitor; and a second wireless current sensor attached to the second phase line and configured to sense a current of the second phase line, wherein the electronic controller is operably coupled to the second switch, the third voltage sensor, the fourth voltage sensor, and the second wireless current sensor.

12. The method of claim 11, the method further comprising:

receiving, via the electronic controller, a third voltage signal indicative of the voltage of the second phase line from the third voltage sensor;

receiving, via the electronic controller, a fourth voltage signal indicative of the voltage of the second capacitor from the fourth voltage sensor;

receiving, via the electronic controller, a second current signal indicative of the current of the second phase line from the second wireless current sensor;

determining, via the electronic controller, a second phase shift calculation for the voltage of the second phase line based on the second current signal;

determining, via the electronic controller, when the voltage of the second phase line is at zero by comparing the third voltage signal, the fourth voltage signal, and the second phase shift calculation; and transmitting, via the electronic controller, a command to close the second switch when the voltage of the second phase line is at zero.

13. The method of claim 12, the switched capacitor bank system further comprising:

a third capacitor physically supported by the frame;

a third switch selectively connected between the third capacitor and a third phase line, the third switch being physically supported by the frame;

a fifth voltage sensor integrated within a housing of the third switch and configured to sense a voltage of the third phase line;

a sixth voltage sensor integrated within the housing of the third switch and configured to sense a voltage of the third capacitor; and a third wireless current sensor attached to the third phase line and configured to sense a current of the third phase line, wherein the electronic controller is operably coupled to the third switch, the fifth voltage sensor, the sixth voltage sensor, and the third wireless current sensor.

14. The method of claim 13, the method further comprising:

receiving, via the electronic controller, a fifth voltage signal indicative of the voltage of the third phase line from the fifth voltage sensor;

receiving, via the electronic controller, a sixth voltage signal indicative of the voltage of the third capacitor from the sixth voltage sensor;

receiving, via the electronic controller, a third current signal indicative of the current of the third phase line from the third wireless current sensor;

determining, via the electronic controller, a third phase shift calculation for the voltage of the third phase line based on the third current signal;

determining, via the electronic controller, when the voltage of the third phase line is at zero by comparing the fifth voltage signal, the sixth voltage signal, and the third phase shift calculation; and transmitting, via the electronic controller, a command to close the third switch when the voltage of the third phase line is at zero.

15. The method of claim 14, wherein the first current signal includes a phase and a magnitude of the current of the first phase line, the second current signal includes a phase and a magnitude of the current of the second phase line, and the third current signal includes a phase and a magnitude of the current of the third phase line.

16. The method of claim 10, the method further comprising:

determining, via the electronic controller, a time period between previous first switch closing operations and closing the first switch;

comparing, via the electronic controller, the time period to previous time periods for previous first switch closing operations; and determining, via the electronic controller, a time delay for closing the first switch at subsequent closing operations.

17. A switched capacitor bank system comprising:

a plurality of phase lines including a first phase line, a second phase line, and a third phase line;

a switched bank capacitor assembly including a plurality of capacitors including a first capacitor, a second capacitor, and a third capacitor;

a plurality of voltage sensors including a first voltage sensor integrated within a housing of a first switch, the first voltage sensor configured to sense a voltage of the first phase line, a second voltage sensor integrated within the housing of the first switch, the second voltage sensor configured to sense a voltage of the first capacitor, a third voltage sensor configured to sense a voltage of the second phase line, a fourth voltage sensor configured to sense a voltage of the second capacitor, a fifth voltage sensor configured to sense a voltage of the third phase line, and a sixth voltage sensor configured to sense a voltage of the third capacitor;

a plurality of switches including the first switch connected between the first phase line and the first capacitor, a second switch connected between the second phase line and the second capacitor, and a third switch connected between the third phase line and the third capacitor;

a frame arranged to physically support the plurality of capacitors, the plurality of voltage sensors, and the plurality of switches;

a plurality of wireless current sensors including a first wireless current sensor attached to the first phase line and configured to sense a current of the first phase line, a second wireless current sensor attached to the second phase line and configured to sense a current of the second phase line, and a third wireless current sensor attached to the third phase line and configured to sense a current of the third phase line; and an electronic controller including an electronic processor, the electronic controller operably coupled to the switched bank capacitor assembly and the plurality of wireless current sensors, the controller configured to selectively close the plurality of switches to connect the plurality of capacitors to the respective ones of the plurality of phase lines based on signals received from the plurality of voltage sensors and the plurality of wireless current sensors.

18. The switched capacitor bank system of claim 17, wherein selectively closing the plurality of switches includes the electronic controller further configured to:

receive a first voltage signal indicative of the voltage of the first phase line from the first voltage sensor;

receive a second voltage signal indicative of the voltage of the first capacitor from the second voltage sensor;

receive a first current signal indicative of the current of the first phase line from the first wireless current sensor;

determine a first phase shift calculation for the voltage of the first phase line based on the first current signal;

determine when the voltage of the first phase line is at zero by comparing the first voltage signal, the second voltage signal, and the first phase shift calculation; and close the first switch when the voltage of the first phase line is at zero.

19. The switched capacitor bank system of claim 18, wherein selectively closing the plurality of switches includes the electronic controller further configured to:

receive a third voltage signal indicative of the voltage of the second phase line from the third voltage sensor;

receive a fourth voltage signal indicative of the voltage of the second capacitor from the fourth voltage sensor;

receive a second current signal indicative of the current of the second phase line from the second wireless current sensor;

determine a second phase shift calculation for the voltage of the second phase line based on the second current signal;

determine when the voltage of the second phase line is at zero by comparing the third voltage signal, the fourth voltage signal, and the second phase shift calculation; and close the second switch when the voltage of the second phase line is at zero.

20. The switched capacitor bank system of claim 19, wherein selectively closing the plurality of switches includes the electronic controller further configured to:

receive a fifth voltage signal indicative of the voltage of the third phase line from the fifth voltage sensor;

receive a sixth voltage signal indicative of the voltage of the third capacitor from the sixth voltage sensor;

receive a third current signal indicative of the current of the third phase line from the third wireless current sensor;

determine a third phase shift calculation for the voltage of the third phase line based on the third current signal;

determine when the voltage of the third phase line is at zero by comparing the fifth voltage signal, the sixth voltage signal, and the third phase shift calculation; and close the third switch when the voltage of the third phase line is at zero.

* * * * *